United States Patent
Kaess et al.

(10) Patent No.: US 11,343,920 B2
(45) Date of Patent: May 24, 2022

(54) METHOD FOR PRODUCING AN ELECTRONIC CONTROL MODULE

(71) Applicant: Robert Bosch GmbH, Stuttgart (DE)

(72) Inventors: Udo Kaess, Walheim (DE); Uwe Katzenwadel, Oberriexingen (DE); Peter Weiberle, Sachsenheim (DE)

(73) Assignee: Robert Bosch GmbH, Stuttgart (DE)

( * ) Notice: Subject to any disclaimer, the term of this patent is extended or adjusted under 35 U.S.C. 154(b) by 148 days.

(21) Appl. No.: 16/603,470

(22) PCT Filed: Mar. 21, 2018

(86) PCT No.: PCT/EP2018/057135
§ 371 (c)(1),
(2) Date: Oct. 7, 2019

(87) PCT Pub. No.: WO2018/188924
PCT Pub. Date: Oct. 18, 2018

(65) Prior Publication Data
US 2021/0127498 A1    Apr. 29, 2021

(30) Foreign Application Priority Data
Apr. 10, 2017    (DE) .................. 10 2017 206 105.7

(51) Int. Cl.
*H05K 3/34*    (2006.01)
*H05K 1/11*    (2006.01)
*H05K 1/18*    (2006.01)

(52) U.S. Cl.
CPC ............. *H05K 3/341* (2013.01); *H05K 1/111* (2013.01); *H05K 1/181* (2013.01); *H05K 3/3457* (2013.01); *H05K 2201/10151* (2013.01)

(58) Field of Classification Search
CPC ...... H05K 3/341; H05K 3/3457; H05K 1/111; H05K 1/181; H05K 2201/10151;
(Continued)

(56) References Cited

U.S. PATENT DOCUMENTS

2005/0161492 A1* 7/2005 Yamamoto ............. H05K 3/341
                                                    228/180.21
2012/0133001 A1* 5/2012 Tkaczyk ............... A61B 8/4483
                                                    257/414
(Continued)

FOREIGN PATENT DOCUMENTS

CN        1575108 A      2/2005
CN      105027691 A     11/2015
(Continued)

OTHER PUBLICATIONS

International Search Report corresponding to PCT Application No. PCT/EP2018/057135, dated Jun. 14, 2018 (German and English language document) (7 pages).

*Primary Examiner* — Peter Dungba Vo
*Assistant Examiner* — Azm A Parvez
(74) *Attorney, Agent, or Firm* — Maginot, Moore & Beck LLP

(57) ABSTRACT

A method for producing an electronic sensor module includes applying first soldering material onto electrical soldering pads of a printed circuit board element and/or electrical soldering pads of a printed circuit board element contact side of a sensor carrier, arranging the sensor carrier with the electrical soldering pads of the printed circuit board element contact side on the electrical soldering pads of the printed circuit board element to produce electrical connections between connecting lines and the printed circuit board element, applying second soldering material onto electrical connecting elements of a sensor element and/or soldering pads of the sensor receptacle, arranging the sensor element (Continued)

in the sensor receptacle such that the second soldering material produces electrical connections between the electrical connecting elements of the sensor element and the soldering pads of the sensor receptacle, and reflow-soldering the first soldering material and the second soldering material in a joint reflow-soldering process.

14 Claims, 3 Drawing Sheets

(58) Field of Classification Search
CPC ......... Y10T 29/49144; Y10T 29/49142; Y10T 29/4913; Y10T 29/49117; Y10T 29/49002
USPC ............... 29/840, 839, 832, 829, 825, 592.1
See application file for complete search history.

(56) References Cited

U.S. PATENT DOCUMENTS

| 2013/0249542 | A1* | 9/2013 | Zhao | G01R 33/0052 |
| | | | | 324/244 |
| 2015/0334843 | A1* | 11/2015 | Jung | H05K 3/4611 |
| | | | | 361/764 |

FOREIGN PATENT DOCUMENTS

| DE | 10 2013 100 197 A1 | 7/2014 |
| DE | 10 2014 216 587 A1 | 9/2015 |
| DE | 10 2014 217 556 A1 | 3/2016 |

* cited by examiner

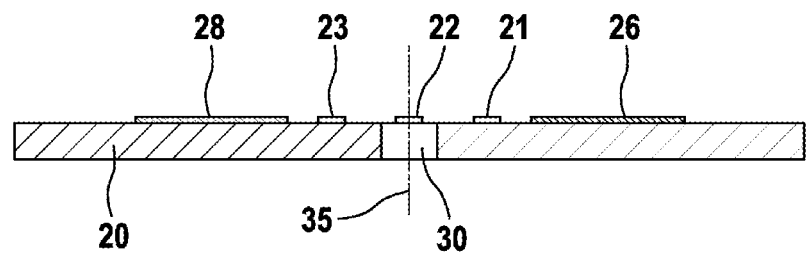
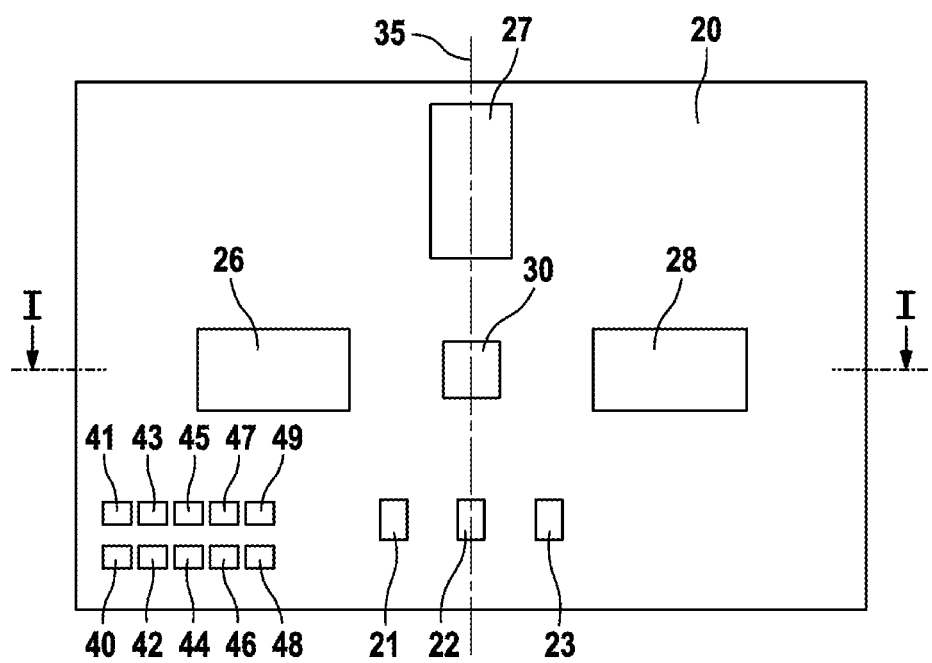

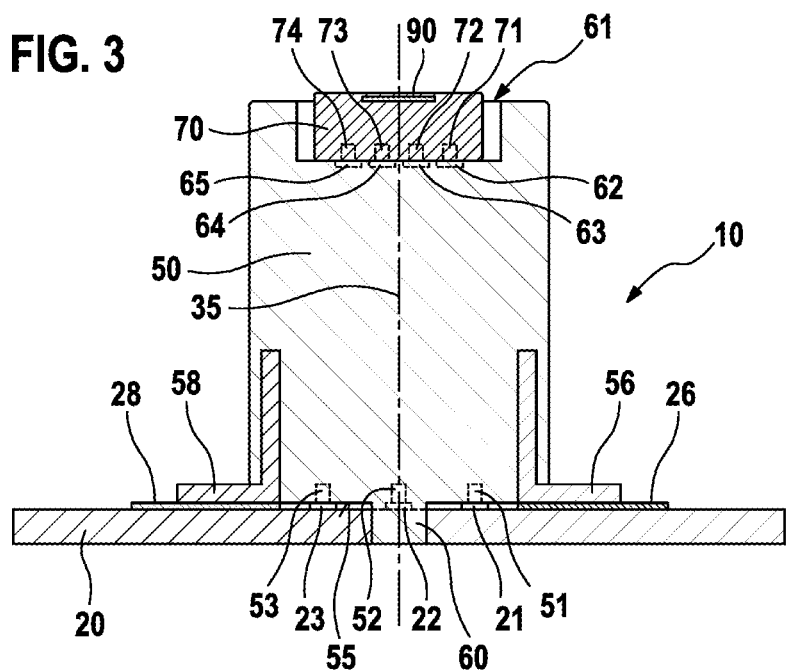
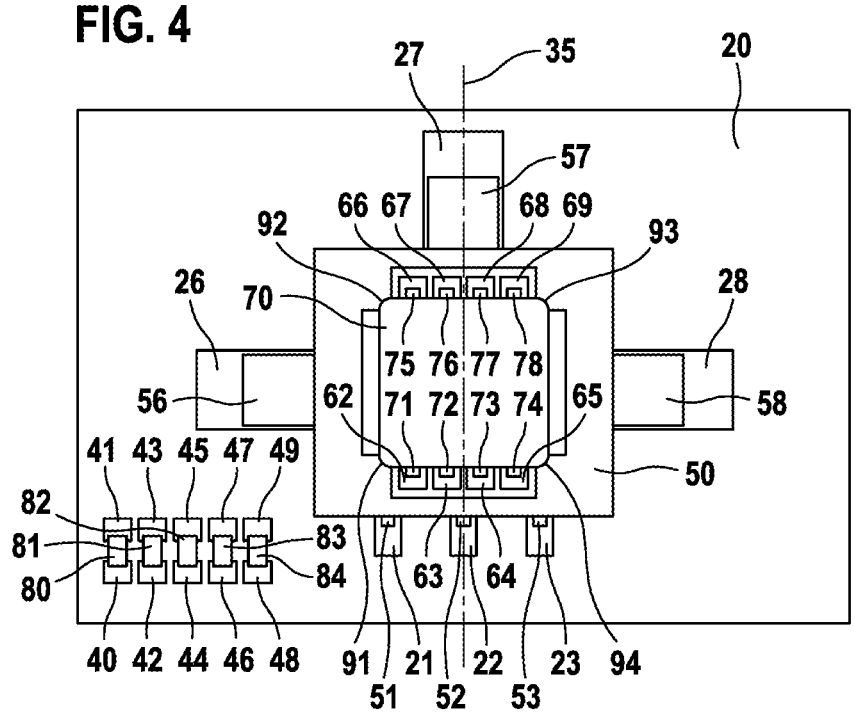

METHOD FOR PRODUCING AN ELECTRONIC CONTROL MODULE

This application is a 35 U.S.C. § 371 National Stage Application of PCT/EP2018/057135, filed on Mar. 21, 2018, which claims the benefit of priority to Serial No. DE 10 2017 206 105.7, filed on Apr. 10, 2017 in Germany, the disclosures of which are incorporated herein by reference in their entirety.

The disclosure relates to a method for producing an electronic control module.

BACKGROUND

In transmission controllers, at least one first measurement value typically has to be detected or measured. The transmission controller often comprises an electronic control module with a printed circuit board element on which the electronic components are arranged. A sensor element or sensor is arranged at a distance from the printed circuit board element and electrically connected to the printed circuit board element by means of a sensor carrier or sensor dome. The height of the sensor dome can be selected in such a way that the sensor element or the sensor is arranged at a defined distance from an object to be measured or from the printed circuit board element.

The sensor carrier or the sensor dome is mechanically fastened on the printed circuit board element and electrically connected to the printed circuit board element. The sensor element or the sensor is likewise mechanically and electrically connected to the sensor dome or sensor carrier.

One disadvantage of methods known to date for producing an electronic sensor module is that they are very complicated and take a long time.

SUMMARY

Embodiments of the present disclosure can advantageously allow a sensor module to be produced in a technically simple manner in a short time.

A first aspect of the disclosure proposes a method for producing an electronic sensor module for measuring at least one measurement value, in particular for a transmission controller, wherein the method comprises the following steps: providing a printed circuit board element;
providing a sensor element; providing a sensor carrier with a sensor receptacle for receiving the sensor element, wherein the sensor carrier has electrical connecting lines between solder pads of the sensor receptacle and electrical solder pads of a printed circuit board element contact side of the sensor carrier, wherein the sensor receptacle is formed on a side of the sensor carrier which is averted from the printed circuit board element contact side; applying first solder material to electrical solder pads of the printed circuit board element and/or to the electrical solder pads of the printed circuit board element contact side of the sensor carrier;
arranging the sensor carrier with the electrical solder pads of the printed circuit board element contact side on the electrical solder pads of the printed circuit board element for establishing a respective electrical connection between the connecting line and the printed circuit board element by means of the first solder material; applying second solder material to electrical connecting elements of the sensor element and/or to the solder pads of the sensor receptacle; arranging the sensor element in the sensor receptacle in such a way that the second solder material establishes a respective electrical connection between the electrical connecting elements of the sensor element and the solder pads of the sensor receptacle by means of the second solder material; and reflow soldering the first solder material and the second solder material in a joint reflow soldering process.

One advantage of this is that time and energy are generally saved since the sensor element is connected to the sensor carrier and the sensor carrier is connected to the printed circuit board element in a single reflow soldering process. As a result, the production costs are usually lowered. In addition, it is generally ensured that the connection between the sensor element and the sensor carrier and also between the sensor carrier and the printed circuit board element are exposed to the same temperatures. This typically leads to particularly uniform reflow solder connections.

According to one embodiment, the method further comprises the following steps:
providing further electronic components, in particular further electronic components, preferably further passive electronic components, for establishing electromagnetic compatibility of the sensor module; applying a third solder material to electrical connecting elements of the further electronic components and/or to further solder pads of the printed circuit board element; and arranging the further electronic components respectively on the further solder pads of the printed circuit board element for establishing a respective electrical connection between the further electronic components and the printed circuit board element by means of the third solder material; wherein the third solder material is reflow-soldered in the same reflow soldering process in which the first solder material and the second solder material are jointly reflow-soldered. One advantage of this is that the time required for production is generally further reduced. In addition, the three solder materials are typically particularly uniformly reflow-soldered.

According to one embodiment, the printed circuit board element further comprises mechanical solder pads and the printed circuit board element contact side of the sensor carrier further comprises mechanical solder pads, wherein first solder material is likewise applied to the mechanical solder pads of the printed circuit board element and/or of the printed circuit board element contact side of the sensor carrier, wherein, with the arrangement of the sensor carrier with the printed circuit board element contact side on the printed circuit board element, the mechanical solder pads of the printed circuit board element contact side of the sensor carrier are additionally connected to the mechanical solder pads of the printed circuit board element by means of the first solder material, wherein the first solder material of the mechanical solder pads is reflow-soldered in the same reflow soldering process as the first solder material of the electrical solder pads. The advantage of this is that firstly the sensor element is electrically connected to the printed circuit board element by means of the sensor carrier and secondly, at the same time, the sensor carrier is mechanically fastened to the printed circuit board element using the same reflow soldering process. This generally reduces the time required for producing the sensor module even further.

According to one embodiment, the sensor carrier is mechanically connected to the printed circuit board element exclusively by means of the first solder material. One advantage of this is that the sensor carrier is typically both electrically and also mechanically connected to the printed circuit board element in a technically particularly simple manner. In addition, solder material is generally saved, and therefore the production costs fall further.

According to one embodiment, the sensor element is mechanically connected to the sensor carrier exclusively by means of the second solder material. The advantage of this is that the sensor element is generally electrically and also mechanically connected to the sensor carrier in a technically particularly simple manner.

According to one embodiment, the sensor receptacle has alignment elements for aligning the sensor element in the sensor receptacle. As a result, the insertion of the sensor element into the sensor receptacle is generally simplified and can be carried out in a particularly precise manner. Therefore, the time required for production is generally reduced even further.

According to one embodiment, the method further comprises the following step: applying an encapsulation material to at least a portion of the printed circuit board element in such a way that the electrical connection or the electrical connections between the sensor carrier and the printed circuit board element is/are covered by the encapsulation material, and in at least a portion of the sensor receptacle in such a way that the electrical connections between the sensor element and the sensor carrier are covered. One advantage of this is that the electrical contact points or contact regions are generally protected from the surrounding area in a technically particularly simple manner. This is particularly advantageous when the sensor module is arranged or operated in an oil environment. Under unfavorable circumstances, the oil may contain metal particles which can trigger a short circuit. Therefore, a particularly short circuit-safe control module is generally achieved by covering with encapsulation material.

According to one embodiment, the encapsulation material is inserted into the sensor receptacle in such a way that a side of the sensor element which is averted from the sensor carrier is not covered by the encapsulation material. As a result, it is generally possible to keep an air gap between the sensor element or the sensor and the element (for example a wheel of a vehicle or an encoder magnet) of which the property or properties are detected by means of the sensor or sensor element to be kept very slight or small. This typically improves the level of precision with which the measurement value or the measurement values are detected by the sensor module.

According to one embodiment, the sensor element comprises a Hall sensor, wherein the sensor receptacle has a recess for receiving a permanent magnet in such a way that the permanent magnet can be arranged between the sensor element and the printed circuit board element, wherein the permanent magnet is inserted into the recess before the sensor element is inserted into the sensor receptacle. As a result, a sensor module by means of which a magnetic field or a rotation speed can be measured can typically be produced in a technically simple manner in a short time.

According to one embodiment, a reflow adhesive is applied to the electrical and/or mechanical solder pads of the printed circuit board element and/or of the sensor carrier before the sensor carrier is arranged on the printed circuit board element, and/or a reflow adhesive is applied to the solder pads of the sensor receptacle and/or to the electrical connecting elements of the sensor element before the sensor element is inserted into the sensor receptacle. One advantage of this is that unintentional movement or slipping of the elements (sensor element, sensor carrier, printed circuit board element) in relation to one another before the reflow soldering is reliably prevented in general. As a result, the method is generally particularly reliable.

Concepts concerning embodiments of the present disclosure can be regarded as being based on the ideas and insights described below, amongst others.

It should be noted that some of the possible features and advantages of the disclosure are described herein with reference to different embodiments of the method for producing a sensor module. A person skilled in the art recognizes that the features can be combined, adapted or exchanged in a suitable way to arrive at further embodiments.

BRIEF DESCRIPTION OF THE DRAWINGS

Embodiments of the disclosure are described below with reference to the accompanying drawings, wherein neither the drawings nor the description should be construed as restricting the disclosure.

FIG. 1 shows a schematic cross-sectional view of a printed circuit board element of one embodiment of the control module according to the disclosure;

FIG. 2 shows a plan view of the printed circuit board element from FIG. 1;

FIG. 3 shows a cross-sectional view of one embodiment of the control module according to the disclosure without sealing-off material and without encapsulation material;

FIG. 4 shows a plan view of the control module from FIG. 3; and

The figures are only schematically depicted and not true to scale. In the figures, identical reference symbols denote features which are the same or have the same effect.

DETAILED DESCRIPTION

Figure 5:
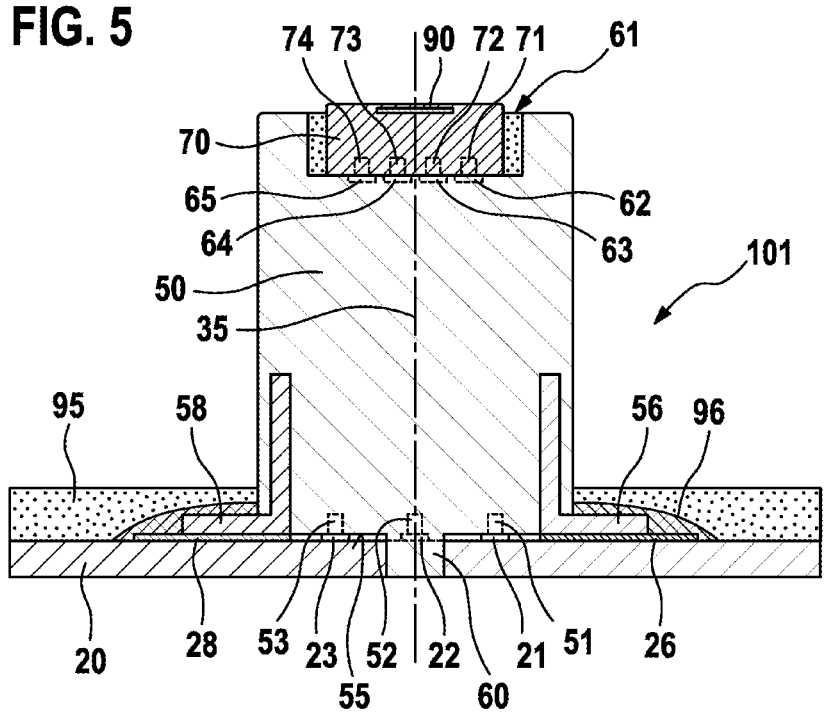
FIG. 5 shows a cross-sectional view of the control module from FIG. 3 and FIG. 4 with sealing-off material and with encapsulation material.

FIG. 1 shows a schematic cross-sectional view of a printed circuit board element 20 of one embodiment of the control module according to the disclosure. FIG. 2 shows a plan view of the printed circuit board element 20 from FIG. 1.

The printed circuit board element 20 can be, for example, a printed circuit board (PCB). The electrical connections within the printed circuit board element 20 are not illustrated in the drawings. The printed circuit board element 20 has a centrally arranged cutout 30 which extends over the entire height of the printed circuit board element 20. The height runs from top to bottom in FIG. 1 and into and, respectively, out of the plane of the drawing in FIG. 2. A center line 35 runs centrally through the cutout 30.

Three mechanical solder pads 26, 27, 28 are arranged on the printed circuit board element 20. These mechanical solder pads are each arranged in a manner offset through an angle of approximately 90° around the center line 35.

The mechanical solder pads 26, 27, 28 serve to establish a mechanical connection between a sensor carrier 50, which holds a sensor element 70 at a distance from the printed circuit board element 20, and the printed circuit board element 20. The mechanical solder pads 26, 27, 28 are each of rectangular design. Other shapes are conceivable in each case.

In addition, three electrical solder pads 21, 22, 23 are arranged on the printed circuit board element 20. The electrical solder pads 21, 22, 23 serve to establish an electrical connection between the sensor carrier 50 and the printed circuit board element 20 or the electrical lines within the printed circuit board element 20. The electrical solder pads 21, 22, 23 are each of rectangular design. Other shapes are conceivable.

It is also conceivable for the electrical solder pads 21, 22, 23 of the printed circuit board element 20 to simultaneously be the mechanical solder pads 26, 27, 28 of the printed circuit board element 20. That is to say that solder pads of the printed circuit board element 20 simultaneously fulfil both functions in each case.

In addition, further electrical solder pads 40-49 are arranged on the printed circuit board element 20. The further electrical solder pads 40-49 serve to establish a respective electrical connection between further electronic components 80-84, in particular passive electronic components for establishing electromagnetic compatibility (EMC), and the printed circuit board element 20 or the electrical lines within the printed circuit board element 20. The further electrical solder pads 40-49 are each arranged in pairs in relation to one another, so that in each case two of the electrical solder pads are connected to one further electronic component 80-84. The further electrical solder pads 40-49 can also serve to mechanically fasten the further electronic components 80-84 on the printed circuit board element 20. The number of further electronic components 80-84 is five in FIG. 4. Only one, two, three, four further electronic components 80-84 are also conceivable.

All said solder pads 21, 22, 23 of the printed circuit board element 20 are located on the same side of the printed circuit board element 20.

The number of electrical solder pads 21, 22, 23 and/or of mechanical solder pads 26, 27, 28 of the printed circuit board element 20 and also of the sensor carrier 50 can each be greater than or less than three, for example two, four, five or more than five. The number of electrical solder pads 51, 52, 53 of the sensor carrier 50 is generally equal to the number of electrical solder pads 21, 22, 23 of the printed circuit board element 20. The number of mechanical solder pads 56, 57, 58 of the sensor carrier 50 is typically equal to the number of mechanical solder pads 26, 27, 28 of the printed circuit board element 20.

A first solder material (for example soft solder in the form of a solder paste) is now applied to the electrical solder pads 21, 22, 23 and the mechanical solder pads 26, 27, 28 of the printed circuit board element 20. As an alternative or in addition, the first solder material can be applied to the electrical solder pads 21, 22, 23 and the mechanical solder pads of the printed circuit board element contact side 55 of the sensor carrier 50. A mixture thereof is also possible, that is to say that first solder material is applied to a portion of the electrical solder pads 21, 22, 23 and/or to a portion of the mechanical solder pads 26, 27, 28 of the printed circuit board element 20, and to a portion of the electrical solder pads 51, 52, 53 and/or to a portion of the mechanical solder pads 56, 57, 58 of the sensor carrier 50. It is relevant for first solder material to be arranged between each solder pad 51, 52, 53 of the sensor carrier 50 and each solder pad 21, 22, 23, 26, 27, 28 of the printed circuit board element 20 after the sensor carrier 50 is arranged on the printed circuit board element 20. The application can be carried out, for example, by dispensing.

FIG. 3 shows a cross-sectional view of one embodiment of the control module according to the disclosure without sealing-off material 96 and without encapsulation material 95.

FIG. 4 shows a plan view of the control module from FIG. 3.

A sensor carrier 50 or sensor dome is now arranged on the printed circuit board element 20 and, by way of its protrusion 60, inserted into the cutout 30 of the printed circuit board element 20. The sensor carrier 50 has a printed circuit board element contact side 55 which faces the printed circuit board element 20. This printed circuit board element contact side is located on the bottom side of the sensor carrier 50 in FIG. 3. A sensor receptacle 61 for receiving a sensor element 70 is formed on that side which is averted from the printed circuit board element contact side 55. The sensor receptacle 61 can be, for example, a recess or cutout 30 with a circumferential edge.

The sensor carrier 50 has three mechanical solder pads 56, 57, 58 on the printed circuit board element contact side 55. The three mechanical solder pads 56, 57, 58 are each part of an L-shaped mechanical fastening element.

The sensor carrier 50 has three electrical solder pads 51, 52, 53 on the printed circuit board element contact side 55. The electrical solder pads 51, 52, 53 of the sensor carrier 50 are electrically connected to electrical solder pads 62-69 of the sensor receptacle 61 via connecting lines within the sensor carrier 50 (not shown).

The electrical solder pads 51, 52, 53 and mechanical solder pads 56, 57, 58 of the sensor carrier 50 are designed in such a way and the sensor carrier 50 is arranged, by way of its printed circuit board element contact side 55, on the printed circuit board element 20 in such a way that the electrical solder pads 51, 52, 53 and mechanical solder pads 56, 57, 58 of the sensor carrier 50 are each located on electrical solder pads 21, 22, 23 and, respectively, mechanical solder pads 26, 27, 28 of the printed circuit board element 20. The solder pads 21, 22, 23, 26, 27, 28 of the printed circuit board element 20 each typically have a larger surface area than the solder pads 51, 52, 53 of the sensor carrier 50.

The electrical solder pads 21, 22, 23 and/or mechanical solder pads 26, 27, 28 of the printed circuit board element 20 each run parallel to the electrical solder pads 51, 52, 53 and/or mechanical solder pads 56, 57, 58 of the sensor carrier 50.

The sensor element 70 is arranged in the sensor receptacle 61—either before the sensor carrier 50 is arranged on the printed circuit board element 20 or after the sensor carrier 50 is arranged on the printed circuit board element 20.

A second solder material is applied to the electrical solder pads 62-69 of the sensor receptacle 61 and/or to electrical connecting elements 71-78 of the sensor element 70 before the sensor element 70 is arranged in the sensor receptacle 61.

In addition, a so-called back-bias magnet in the form of a permanent magnet can be inserted into a recess within the sensor receptacle 61. After the sensor element 70 has been inserted into the sensor receptacle 61, the back-bias magnet is located between the sensor element 70 or the sensor 90 and the printed circuit board element 20. In this case, the sensor 90 can be, in particular, a Hall sensor for measuring a magnetic field.

The sensor element 70 has at least one sensor 90. Two, three or more than three sensors are also conceivable. The sensor 90 is encapsulated in the sensor element 70. The sensor element 70 has electrical connecting elements 71-78. The electrical connecting elements 71-78 can be, for example, pins of the sensor 90. It is also conceivable for the sensor element 70 to have solder pads as electrical connecting elements 71-78.

The sensor element 70 is designed in such a way and is arranged in such a way that a respective electrical connection is formed between the electrical connecting elements 71-78 and the solder pads 62-69 of the sensor receptacle 61. The solder pads 62-69 of the sensor receptacle 61 are electrically connected to the solder pads 51, 52, 53 on the printed circuit board element contact side 55 of the sensor carrier 50 via connecting lines. Therefore, the sensor 90 is electrically connected to the printed circuit board element 20 via the electrical connecting line of the sensor carrier 50.

The number of electrical connecting elements 71-78 is eight in FIG. 4. It is also conceivable for the sensor element 70 to have four, five, six, seven, nine, ten or more than ten electrical connecting elements 71-78. The number of solder pads 62-69 of the sensor receptacle 61 is at least as high as the number of electrical connecting elements 71-78 of the sensor element 70. The number of solder pads 62-69 of the sensor receptacle 61 typically corresponds to the number of pins of the sensor element 70.

In the drawings, the sensor element 70 or the sensor 90 comprises a dual flat no-lead package in each case.

The sensor receptacle comprises four alignment elements 91-94 which are arranged around the center line with an angular offset of 90° and which each receive a corner of the cuboidal sensor element 70 in a recess of the alignment element 91-94. As a result, the electrical connecting elements 71-78 of the sensor element 70 reach the solder pads 62-69 of the sensor receptacle 61.

In addition, further electronic components 80-84 are arranged on the printed circuit board element 20 in such a way that each further electronic component is connected to precisely two of the further solder pads 40-49 of the printed circuit board element 20.

The sensor module 10 is now reflow-soldered. This can be carried out, for example, by warming up or heating up the sensor module 10 in a reflow soldering oven. The connections between the electrical solder pads 21, 22, 23 of the printed circuit board element 20 and the electrical solder pads 51, 52, 53 of the sensor carrier 50, between the mechanical solder pads 26, 27, 28 of the printed circuit board element 20 and the mechanical solder pads 56, 57, 58 of the sensor carrier 50 and between the solder pads 62-69 of the sensor receptacle 61 and the electrical connecting elements 71-78 of the sensor element 70 are reflow-soldered in a joint or in a single reflow soldering process or reflow soldering cycle. Therefore, the electrical and mechanical connection between the sensor element 70, the sensor carrier 50 and the printed circuit board element 20 is established using this one joint reflow soldering process.

After this reflow soldering process, the sensor element is mechanically and electrically connected to the sensor carrier 50 and the sensor carrier 50 is mechanically and electrically connected to the printed circuit board element 20.

The sensor carrier 50 consists of a material which does not substantially change its shape during the reflow soldering process. The material of the sensor carrier 50 can be plastic or comprise plastic.

Time and energy are saved since only one single reflow soldering process is required for mechanical fastening and electrical connection.

After the reflow soldering process, a sealing-off material 96 is applied to the electrical solder pads 21, 22, 23 of the printed circuit board element 20 or of the sensor carrier 50.

An encapsulation material 95 is applied to the printed circuit board element 20, said encapsulation material covering all solder pads 21, 22, 23 of the printed circuit board element 20 and all solder pads 56, 57, 58 on the printed circuit board element contact side 55 of the sensor carrier 50 and also the further electronic components 80-84. Encapsulation material 95 is also inserted into the sensor receptacle 61, so that a side or face of the sensor carrier 50 which is averted from the sensor carrier 50 is not covered by the encapsulation material 95. The sensor 90 is arranged in the vicinity of this side or face within the sensor element 70. As a result, an air gap between the sensor 90 and the object to be measured (for example a wheel) can be kept small.

The encapsulation material 95 in the sensor receptacle 61 and the encapsulation material 95 on the printed circuit board element 20 are then cured. This can be carried out, for example, by warming up or heating up.

FIG. 5 shows a cross-sectional view of the control module from FIG. 3 and, respectively, FIG. 4 with sealing-off material 96 and with encapsulation material 95. FIG. 5 shows the finished electronic sensor module 10. The electronic sensor module 10 can be used in a transmission, for example in a transmission of a vehicle.

The sensor element 70 or the sensor 90 can comprise or be a dual flat no-lead (DFN) package. In particular, the sensor element 70 or the sensor 90 can comprise or be an IC with connection pads or electrical connecting elements 71-78 on opposite sides. It is also conceivable for the sensor element 70 or the sensor 90 to comprise or be a land grid array (LGA) package. A quad flat no-lead package is likewise conceivable as the sensor element 70 or sensor 90 or as part thereof. If installation space is not important, any other standard SMD housing, such as SOIC8 or SOT89, SOT23 for example, can also be used.

The electrical connecting lines within the sensor carrier 50 can be embedded metallic elements or metallic elements encapsulated by injection molding. As an alternative, the electrical connecting lines of the sensor carrier 50 can have elements which are fired into the sensor carrier 50 or the material of the sensor carrier 50. This means that the electrical connecting lines are inserted into the sensor carrier 50 only after the material or the shape of the sensor carrier 50 is formed. The fired-in elements have, at each of their two opposite ends, flexible parts for forming the electrical solder pads 51, 52, 53.

The respective solder pad 21, 22, 23, 26, 27, 28 can comprise, in particular, a face or a point which can be mechanically and/or electrically connected to another solder pad 21, 22, 23, 26, 27, 28 or to an electrical connecting element (for example a pin of an integrated circuit) by means of a solder material.

A reflow adhesive can be applied to the solder pads 51, 52, 53 of the sensor carrier 50 and/or of the printed circuit board element 20 before the sensor carrier 50 is arranged on the printed circuit board element 20. As a result, particularly secure fixing of the sensor carrier on the printed circuit board element 20 is achieved before the reflow soldering. The same applies to the solder pads 62-69 of the sensor receptacle 61.

Finally, it should be noted that terms such as "having", "comprising", etc. do not exclude other elements or steps, and terms such as "a" or "an" do not exclude a multiplicity. Reference signs in the claims are not intended to be regarded as restrictive.

The invention claimed is:

1. A method for producing an electronic sensor module for measuring at least one measurement value, the electronic sensor module including a printed circuit board element, a sensor element, and a sensor carrier with a sensor receptacle configured to receive the sensor element, wherein the sensor carrier has electrical connecting lines between solder pads of the sensor receptacle and first electrical solder pads of a contact side of the sensor carrier that electrically contacts the printed circuit board element, wherein the sensor receptacle is formed on a side of the sensor carrier opposite the contact side, the method comprising:

applying first solder material to second electrical solder pads of the printed circuit board element and/or to the first electrical solder pads of the contact side of the sensor carrier;

arranging the sensor carrier with the first electrical solder pads on the second electrical solder pads so as to establish respective electrical connections between the connecting lines and the printed circuit board element via the first solder material;

applying second solder material to electrical connecting elements of the sensor element and/or to the solder pads of the sensor receptacle;

arranging the sensor element in the sensor receptacle in such a way that the second solder material establishes respective electrical connections between the electrical connecting elements of the sensor element and the solder pads of the sensor; and reflow soldering the first solder material and the second solder material in a joint reflow soldering process.

2. The method as claimed in claim 1, further comprising:

applying a third solder material to electrical connecting elements of further electronic components, which are configured for establishing electromagnetic compatibility of the sensor module, and/or to further solder pads of the printed circuit board element;

arranging the further electronic components on the further solder pads of the printed circuit board element so as to establish electrical connections between the further electronic components and the printed circuit board element via the third solder material; and the reflow soldering of the first and second solder materials includes reflow soldering the third solder material in the joint reflow soldering process.

3. The method as claimed in claim 1, wherein:

the printed circuit board element further comprises first mechanical solder pads and the contact side of the sensor carrier further comprises second mechanical solder pads, the first solder material is further applied to the first mechanical solder pads and/or the second mechanical solder pads, the arrangement of the sensor carrier on the printed circuit board element includes connecting the second mechanical solder pads to the first mechanical solder pads, and the reflow soldering of the first and second solder materials includes reflow soldering the first solder material of the first and second mechanical solder pads in the joint reflow soldering process.

4. The method as claimed in claim 1, wherein the sensor carrier is mechanically connected to the printed circuit board element exclusively by means of the first solder material.

5. The method as claimed in claim 1, wherein the sensor element is mechanically connected to the sensor carrier exclusively by means of the second solder material.

6. The method as claimed in claim 1, wherein the sensor receptacle has alignment elements configured for aligning the sensor element in the sensor receptacle.

7. The method as claimed in claim 1, further comprising:

applying an encapsulation material to at least a portion of the printed circuit board element in such a way that the electrical connections between the sensor carrier and the printed circuit board element are covered by the encapsulation material; and applying the encapsulation material in at least a portion of the sensor receptacle in such a way that the electrical connections between the sensor element and the sensor carrier are covered.

8. The method as claimed in claim 7, wherein the encapsulation material is inserted into the sensor receptacle in such a way that a side of the sensor element opposite the sensor carrier is not covered by the encapsulation material.

9. The method as claimed in claim 1, wherein:

the sensor element comprises a Hall sensor, the sensor receptacle has a recess configured to receive a permanent magnet in such a way that the permanent magnet is arranged between the sensor element and the printed circuit board element, and the permanent magnet is inserted into the recess before the sensor element is inserted into the sensor receptacle.

10. The method as claimed in claim 1, further comprising at least one of:

applying a first reflow adhesive to at least one solder pad of the first electrical solder pads, the second electrical solder pads, and/or first mechanical solder pads of the printed circuit board element before arranging the sensor carrier on the printed circuit board element; and applying a second reflow adhesive to the solder pads of the sensor receptacle and/or to the electrical connecting elements of the sensor element before arranging the sensor element in the sensor receptacle.

11. The method as claimed in claim 1, wherein the electronic sensor module is configured for a transmission controller.

12. The method as claimed in claim 2, wherein the further electronic components are passive electronic components.

13. The method as claimed in claim 6, wherein each of the alignment elements defines a recess configured to receive a portion of the sensor element.

14. The method as claimed in claim 6, wherein each of the alignment elements defines a recess configured to receive a respective corner of the sensor element.

* * * * *